US012700842B2

(12) United States Patent
Chen et al.

(10) Patent No.: US 12,700,842 B2
(45) Date of Patent: Aug. 4, 2026

(54) PROGRAMABLE GAIN AMPLIFIER AND GAIN CONTROL METHOD

(71) Applicant: REALTEK SEMICONDUCTOR CORPORATION, Hsinchu (TW)

(72) Inventors: Chien Wen Chen, Hsinchu (TW); Yi-Ching Liao, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 947 days.

(21) Appl. No.: 17/817,375

(22) Filed: Aug. 4, 2022

(65) Prior Publication Data

US 2023/0179161 A1     Jun. 8, 2023

(51) Int. Cl.
H03G 3/30          (2006.01)
H03F 3/45          (2006.01)
(52) U.S. Cl.
CPC ........... H03G 3/30 (2013.01); H03F 3/45475 (2013.01); H03G 2201/103 (2013.01)
(58) Field of Classification Search
CPC .... H03G 3/30; H03G 2201/103; H03G 3/008; H03F 3/45475; H03F 2203/45526; H03F 2203/45551
USPC .......................................................... 330/254
See application file for complete search history.

(56) References Cited

U.S. PATENT DOCUMENTS

| | | | |
|---|---|---|---|
| 9,692,376 B2 | 6/2017 | Schie | |
| 2021/0181044 A1* | 6/2021 | Mcveigh | H03M 1/662 |
| 2022/0167901 A1* | 6/2022 | Park | H01L 24/83 |
| 2022/0407481 A1* | 12/2022 | Biswas | H03F 3/45753 |

FOREIGN PATENT DOCUMENTS

KR          20060077156 A  *  7/2006  ........... H03H 19/004

* cited by examiner

*Primary Examiner* — Andrea Lindgren Baltzell
*Assistant Examiner* — Jose E Pinero
(74) *Attorney, Agent, or Firm* — WPAT, P.C.; Anthony King

(57) ABSTRACT

A program gain amplifier includes an operational amplifier and a capacitor array. The capacitor array includes a first, second, and third capacitors selectively coupled to the operational amplifier or ground according to a first, second, and third switches, respectively. The first, second, and third capacitors have a first, second, and third capacitance, respectively. The third capacitance equals a sum of the first and second capacitance. In a first configuration, the first and second switches are operated at a first conductive state, and the third switch is operated at a second conductive state. When converting to a second configuration from the first configuration, the third switch is operated at the first conductive state, and the first and second switches are operated at the second conductive state. The gain being provided to an input signal in the first and second configurations are the same.

20 Claims, 6 Drawing Sheets

PROGRAMABLE GAIN AMPLIFIER AND GAIN CONTROL METHOD

CROSS-REFERENCE TO RELATED APPLICATIONS

This application claims the benefit of priority to Patent Application No. 110145539, filed in Taiwan on Dec. 6, 2021, which is incorporated by reference in its entirety.

TECHNICAL FIELD

The present application relates to an amplifier and gain control method, particularly to a programmable gain amplifier and a gain control method thereof.

BACKGROUND

When a programmable gain amplifier (PGA) carries out a gain adjustment, a converting of the components inside the PGA generates different disturbance, thereby affecting the stability of the PGA. Therefore, how to reduce the disturbance of gain adjustment has become an important issue of this field.

SUMMARY OF THE INVENTION

An aspect of the present disclosure provides a PGA configured to provide a gain value to an input signal to generate an output signal. The PGA includes an operational amplifier and a capacitor array. The operational amplifier is configured to output the output signal. The capacitor array includes a first capacitor, a second capacitor and a third capacitor arranged in parallel and selectively coupled to an input terminal or a ground terminal of the operational amplifier, according to a first switch, a second switch and a third switch, respectively. The first capacitor, the second capacitor and the third capacitor respectively have a first capacitance, a second capacitance and a third capacitance. The third capacitance equals to a sum of the first capacitance and the second capacitance. In a first configuration, the first switch and the second switch are operated in a first conduction state, and the third switch is operated in a second conduction state, and when converting from the first configuration to a second configuration, the third switch is operated in the first conduction state, and the first switch and the second switch are operated in the second conduction state. The gain value provided in the first configuration and the gain value provided in the second configuration are the same.

Another aspect of the present disclosure provides a gain control method configured to provide a gain value to an input signal to generate an output signal. The gain control method includes: using a capacitor array to receive the input signal, wherein the capacitor array is coupled to an input terminal of an operational amplifier and comprises a first capacitor, a second capacitor and a third capacitor arranged in parallel and selectively coupled to an input terminal or a ground terminal of the operational amplifier according to a first switch, a second switch and a third switch, respectively, wherein the first capacitor, the second capacitor and the third capacitor respectively has a first capacitance, a second capacitance and a third capacitance, wherein the third capacitance equals to a sum of the first capacitance and the second capacitance; in a first configuration, operating the first switch and the second switch in a first conduction state, and operating the third switch in a second conduction state;

when converting from the first configuration to a second configuration, operating the third switch in the first conduction state, and operating the first switch and the second switch in the second conduction state, wherein the gain value provided in the first configuration and the gain value provided in the second configuration are the same; and using the operational amplifier to output the output signal according to the second configuration.

Compared to conventional techniques, the present PGA and gain control method can flexibly adjust the gain value in a way that generates less disturbance so as to increase the stability of the circuit.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
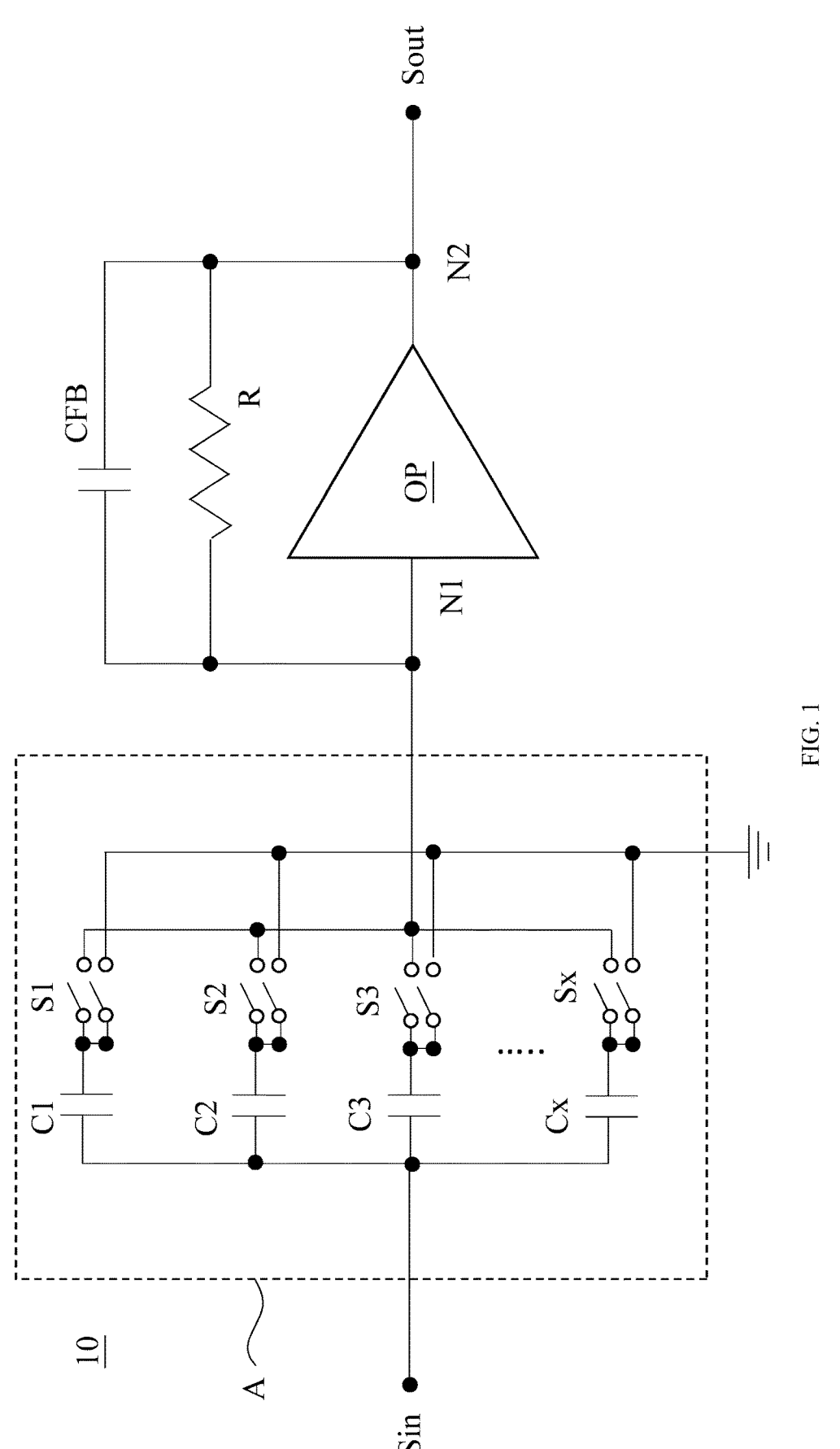
FIG. 1 is a schematic diagram illustrating a PGA according to some embodiments of the present disclosure.

FIG. 1 is a schematic diagram illustrating a PGA 10 according to some embodiments of the present disclosure. The PGA 10 is configured to provide a gain value to an input signal Sin to generate an output signal Sout. The PGA 10 includes a capacitor array A, an operational amplifier OP, a capacitor CFB and a resistor R.

The capacitor array A includes a capacitor C1, capacitor C2, capacitor C3 to capacitor Cx and their corresponding switch S1, switch S2, switch S3 to switch Sx, wherein x is positive integer. In some embodiments, the capacitor array A includes at least three capacitors. The capacitors C1-Cx respectively includes a first terminal configured to receive the input signal Sin and a second terminal correspondingly connected to the switches S1-Sx. The capacitors C1~Cx are disposed in parallel and selectively coupled to the input terminal N1 or ground terminal of the operational amplifier OP according to the switches S1~Sx, respectively.

The capacitor CFB and the resistor R are connected across an output terminal N1 and an output terminal N2 of the operational amplifier OP, respectively. The operational amplifier OP is configured to output the output signal Sout at the output terminal N2.

The gain value of the PGA 10 is controlled by the on/off mode of the switches S1~Sx. The details are described below.

The capacitances of the capacitors C1-Cx in the capacitor array A are not completely identical to each other; in some embodiments, some of the capacitances of the capacitors C1-Cx are the same while others are not. In the present disclosure, according to the arrangement of the switches S1-Sx, when the capacitors C1-Cx are connected to the input terminal N1, these capacitors operate as the capacitor array A1, and when the capacitors C1-Cx are connected to the ground terminal, these capacitors operate as the capacitor array A2. The sum of capacitances of the capacitor array A1 and the capacitor array A2 equals to the capacitance of the capacitor array A. In other words, the changes of the capacitor array A1 and the capacitor array A2 depend on each other. The following is an embodiment of a capacitor array A containing six capacitors, but the invention is not limited thereto, and the number of capacitors of each type is within the contemplated scope of the present disclosure.

Figure 2:
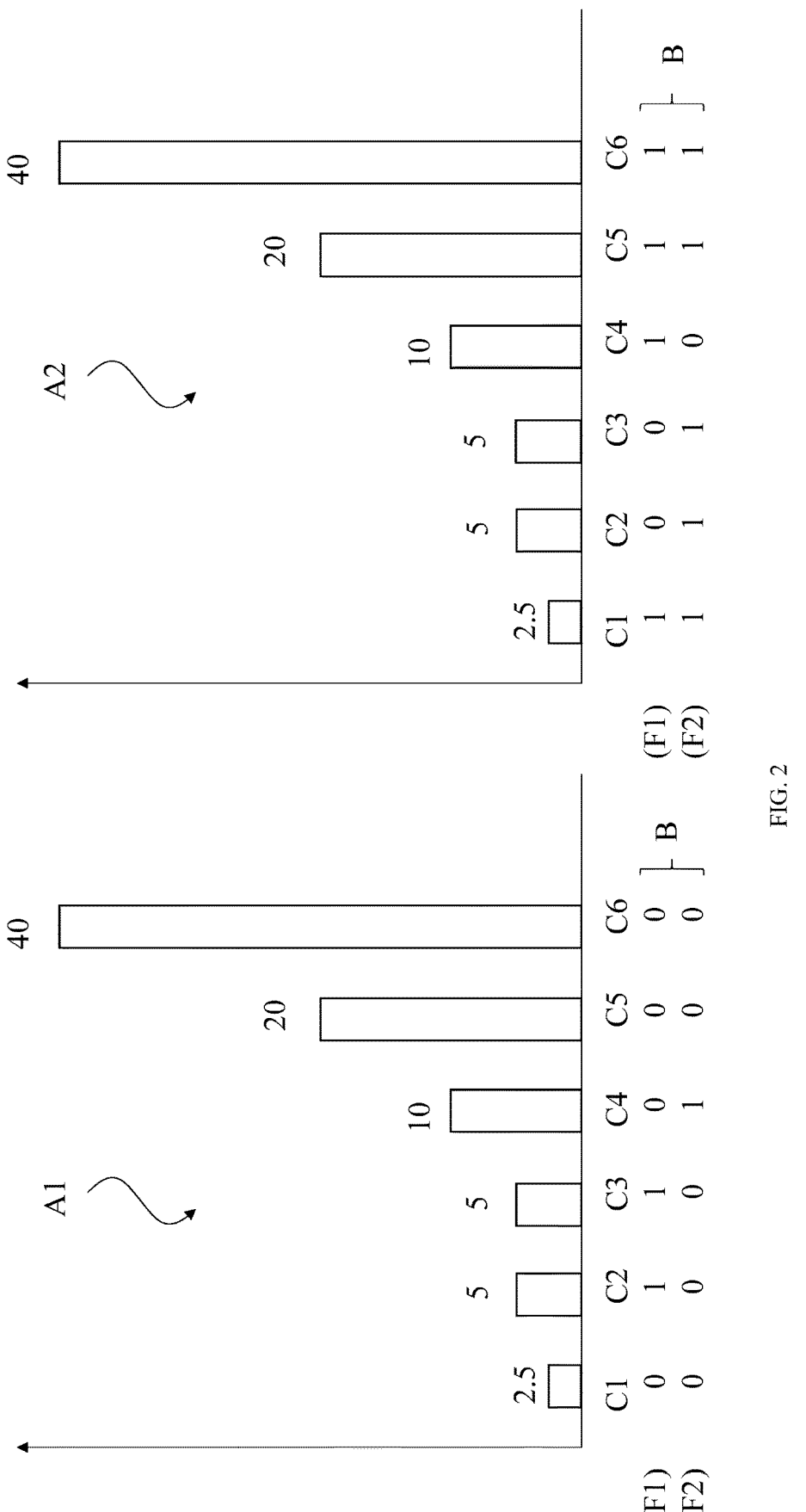
FIG. 2 is a schematic diagram illustrating the converting of a capacitor array between different configurations according to some embodiments of the present disclosure.

Reference is made to FIG. 2. FIG. 2 is a schematic diagram illustrating an embodiment where the capacitor array A1 and the capacitor array A2 convert from a configuration F1 to a configuration F2. The capacitances of the capacitors C1-C6 are 2.5, 5, 5, 10, 20 and 40 units, respectively. The capacitance of the capacitor C4 equals to the sum of the capacitances of the capacitor C2 and the capacitor C3. In some embodiments, the capacitances of the capacitor C2 and the capacitor C3 are not the same. The above-mentioned values are used to indicate the ratio between the capacitance of each capacitor and are not limited to any unit; for example, the foregoing unit can be 1 pF, 10 pF or any other suitable units.

In different configurations of the PGA 10, the switches S1-Sx have different conduction states, so as to control the capacitances of the capacitor array A1 and the capacitor array A2. In some embodiments, the configurations of the capacitor array A1 and the capacitor array A2 are represented using a six-digit array B, wherein the six digits of the numeral array B represent which capacitor is operated as part of the capacitor array A1 (or the capacitor array A2) among capacitors C1-C6, respectively. In the numeral array B, "0" means that the particular capacitor is not operated as part of the capacitor array A1 (or the capacitor array A2), and "1" means that the particular capacitor is operated as part of the capacitor array A1 (or the capacitor array A2). For example, if the numeral array B of capacitor array A1 is "110000", it means that capacitor C1 and capacitor C2 are operated as part of the capacitor array A1, so that the total capacitance value of the capacitor array A1 in this configuration is the sum of the capacitances of the capacitor C1 and the capacitor C2. In contrast, in the configuration where the numeral array B of the capacitor array A1 is "110000", the numeral array B of the capacitor array A2 is "001111", so that the total capacitance value of capacitance array A2 in this configuration is the sum of the capacitances of the capacitors C3-C6.

To facilitate understanding, when the switches S1-Sx are converted to connect the capacitors C1Cx to the input N1, it is called the first conduction state; when the switches S1-Sx are converted to connect the capacitors C1-Cx to the ground terminal, it is called the second conduction state.

Reference is made to FIG. 2, in the configuration F1 of the PGA 10, the numeral array B of the capacitor array A1 is "011000", and the total capacitance is 10 (0+5+5+0+0+ 0=10) units. In the configuration F2, the numeral array B of the capacitor array A1 is "000100", and the capacitance is also 10 (0+0+0+10+0+0=10) units. The capacitances of the two configurations are the same; however, the number of capacitors operating as the capacitor array A1 changes from 2 to 1.

When the PGA 10 switches from the configuration F1 to the configuration F2, the capacitor C1 and the capacitor C2 are converted from the part operating as the capacitor array A1 to the part operating as the capacitor array A2, the capacitor C4 is converted from the part operating as the capacitor array A2 to the part operating as the capacitor array A1, wherein the switches S2, S3 are converted from the first conduction state to the second conduction state, and the switch S4 is converted from the second conduction state to the first conduction state. The total capacitance of the capacitor array A1 in the configuration F1 and the configuration F2 remains unchanged. In some embodiments, the process of converting from the configuration F1 to the configuration F2 is called "handover". The capacitor array A1 that are handed over can have more lower gear (lower capacitance) capacitors for subsequent converting. Therefore, even when the capacitance of the capacitor array A1 has been adjusted to a greater value, the PGA 10 can still use a finer resolution to adjust the gain value.

On the other hand, the adjustment of the capacitor array A2 corresponds to the capacitor array A1. Specifically, the capacitors C1-C6 are commonly used as part of the capacitor array A1 and the capacitor array A2, so that each of the capacitors either is operated as part of the capacitor array A1 or operated as part of the capacitor array A2. Therefore, in the configurations F1-F2 of the PGA 10, the numeral array B of the capacitor array A2 can be represented by "100111" and "111011," respectively, which are opposite to the numeral array B of the capacitor array A2.

In some embodiments, when converting the PGA 10 from the configuration F1 to the configuration F2, because the total capacitance of the capacitor array A1 and the capacitor array A2 remains unchanged, the conversion is also referred to as minimum difference transition.

Figure 3:
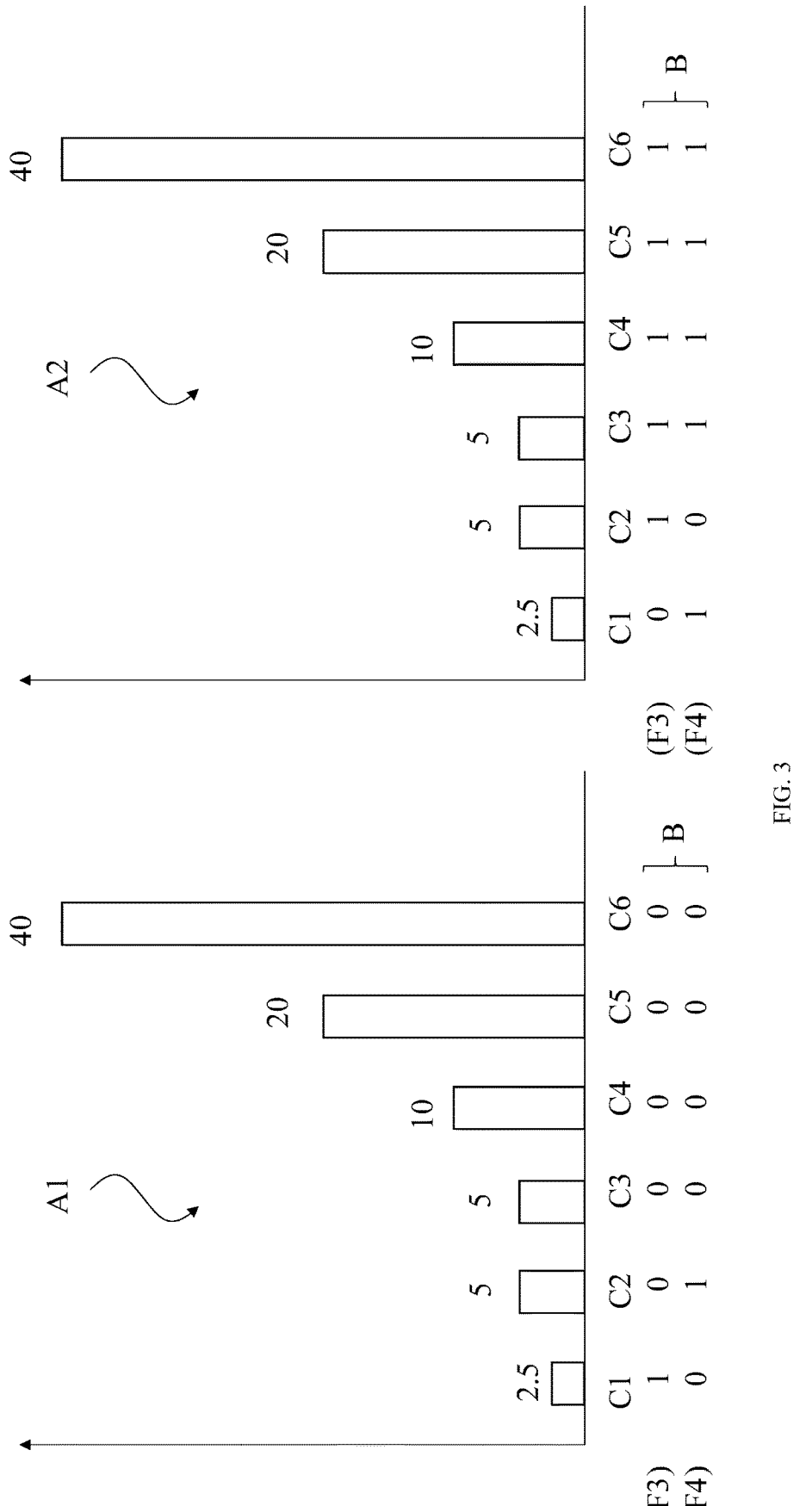
FIG. 3 is a schematic diagram illustrating the converting of a capacitor array between different configurations according to some other embodiments of the present disclosure.

In some embodiments, when the PGA 10 adjusts the gain value, only two switches are changed (the connection states of two capacitors are changed). Reference is made to FIG. 3. FIG. 3 is a schematic diagram illustrating the embodiment where the capacitor array A1 and the capacitor array A2 are converted from the configuration F3 of the PGA 10 to the configuration F4 of the PGA 10.

In the configuration F3 of the PGA 10, the numeral array B of the capacitor array A1 is "100000". When the capacitor array A1 is converted from the configuration F3 to the configuration F4, the switch S1 is converted from a first conduction state to a second conduction state, and the switch S2 is converted from the second conduction state to the first conduction state, so that the numeral array B of the capacitor array A1 is converted as "010000". In this switch, only one switch is converted from the first conduction state to the second conduction state, and only one switch is converted from the second conduction state to the first conduction state. The transition of the capacitor array A2 corresponds to the capacitor array A1, and hence a detailed description thereof is omitted herein.

In some embodiments, when converting from the configuration F3 to the configuration F4, because the capacitor array A1 only converts two switches, the conversion is also referred to as a minimum converting transition. Generally, converting more switches would cause greater disturbance, thereby jeopardizing the stability of the circuit. Therefore, compared to the conventional technology, the PGA 10 according to the present disclosure generates a smaller disturbance when adjusting the gain value so that the circuit is more stable.

In some embodiments, the PGA 10 simultaneously uses the minimum difference transition and minimum converting transition when adjusting the gain value.

Figure 4:
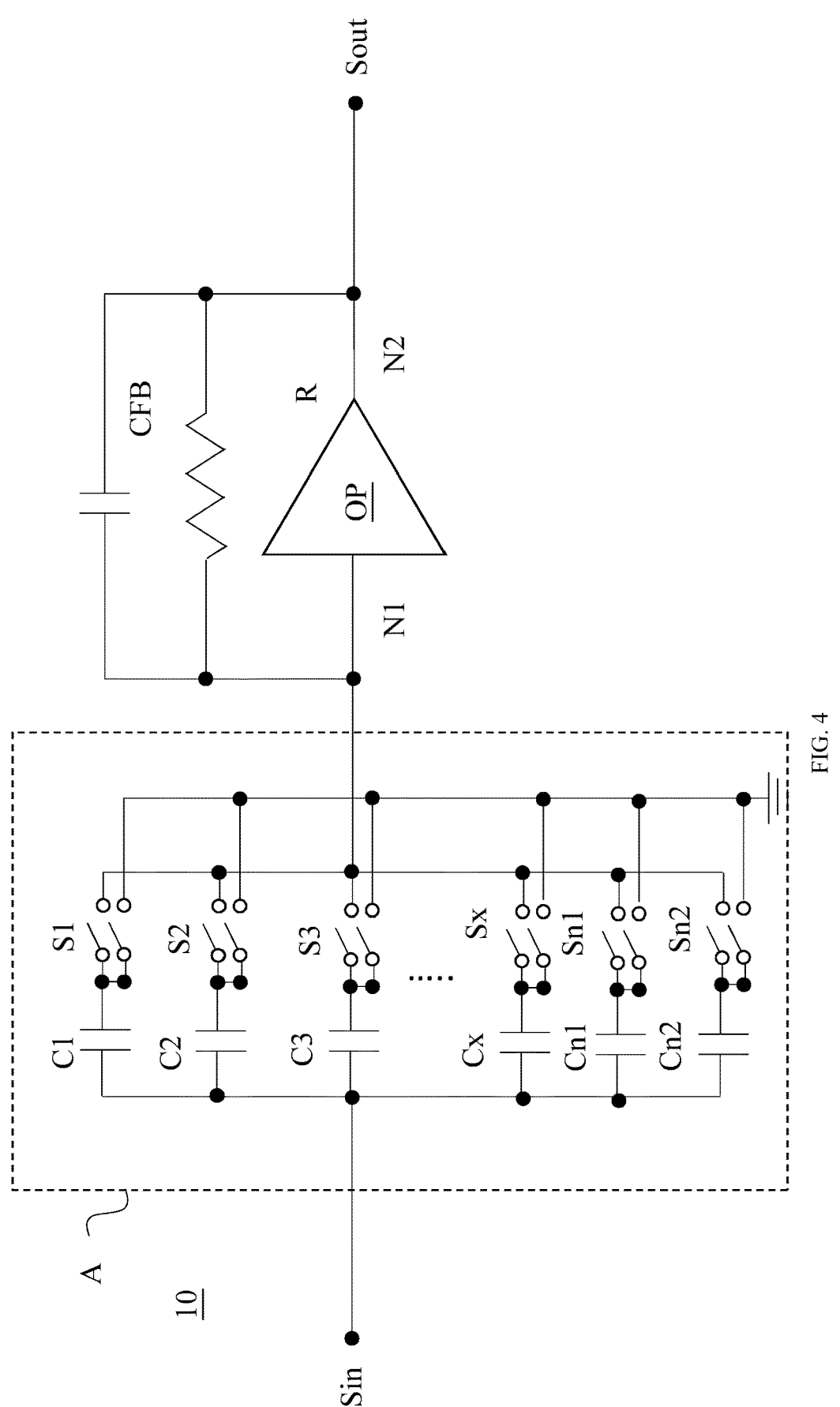
FIG. 4 is a schematic diagram illustrating a PGA according to some other embodiments of the present disclosure.

Reference is made to FIG. 4. FIG. 4 is a schematic diagram illustrating a PGA 10 according to some other embodiments of the present disclosure. In these embodiments, the capacitor array A of the PGA 10 further includes a compensation capacitor Cn1, a compensation capacitor Cn2, a switch Sn1 and a switch Sn2. The capacitors Cn1-Cn2 respectively include a first terminal configured to receive the input signal Sin and a second terminal correspondingly connected to switches Sn1-Sn2. The capacitors Cn1-Cn2 are arranged in parallel and selectively coupled to an input terminal N1 or a ground terminal of the operational amplifier OP according to the switches Sn1-Sn2, respectively.

Similar to the capacitors C1-Cx, the capacitors Cn1-Cn2 can be operated as part of the capacitor array A1 or part of the capacitor array A2 according to the switches Sn1-Sn2, wherein the switches Sn1-Sn2 being conducted to the input terminal N1 is also referred to as a first conduction state, and being conducted to the ground is also referred to as a second conduction state.

Figure 5:
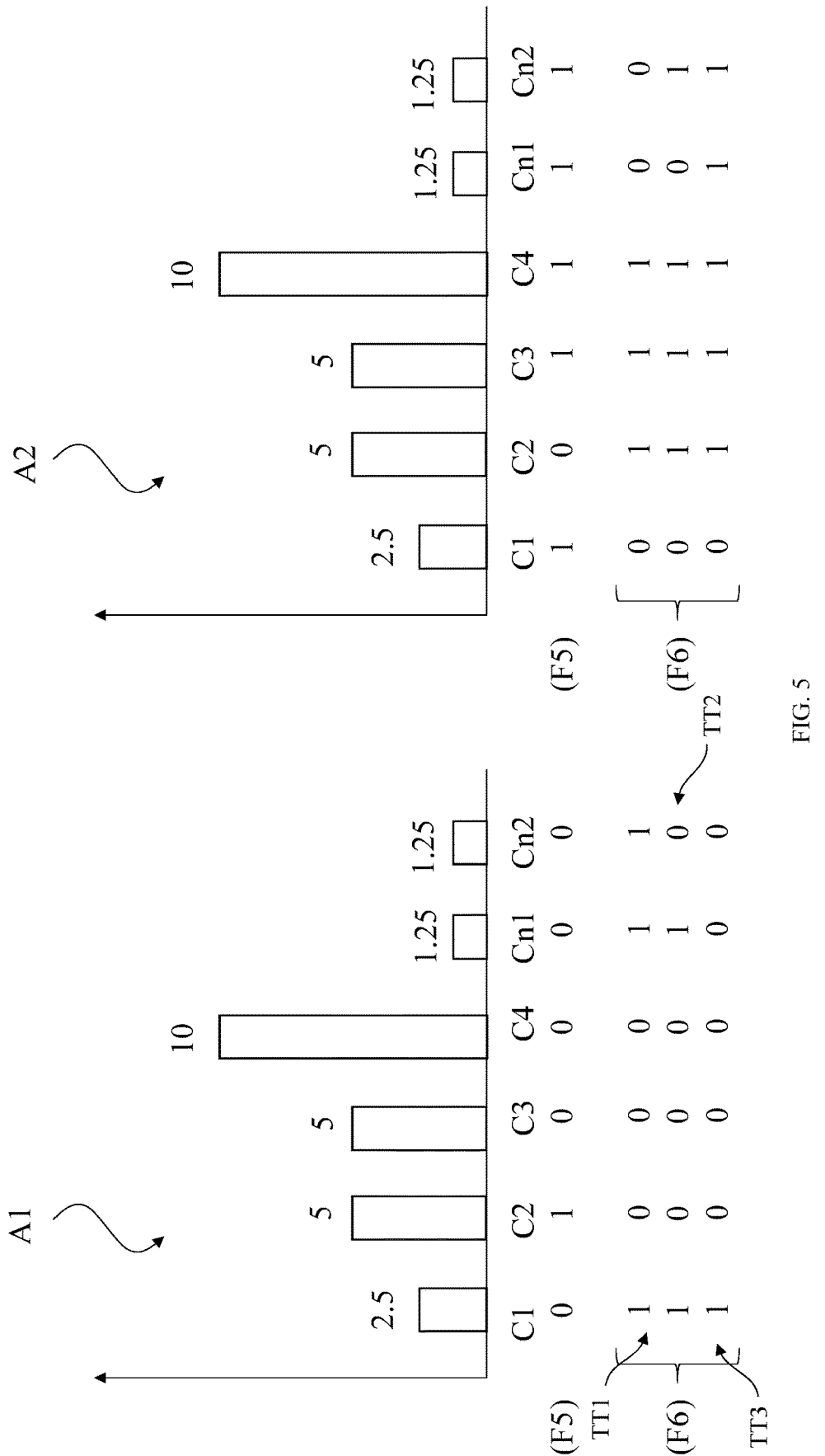
FIG. 5 is a schematic diagram illustrating the converting of a capacitor array between different configurations according to some other embodiments of the present disclosure.

The compensation capacitor Cn1 and the compensation capacitor Cn2 are configured to be in a changing state during a period after the total capacitance of the capacitor array A1 changes, and then enter into a stable state after the changing state, wherein the changing state can be divided into three transient states TT1-TT3 for operation (as shown in FIG. 5). The three transient states TT1-TT3 correspond to the numeral arrays B of the first, second and third column of the capacitor array A1 of the configuration F6 of the PGA 10 in FIG. 5, respectively. In the first transient state TT1, the compensation capacitor Cn1 and the compensation capacitor Cn2 first compensate for the capacitance change of the capacitor array A1 as a result of the transition of the conduction states of the switches S1-Sx. Then in the second transient state TT2, the compensation capacitor Cn1 and the compensation capacitor Cn2 are gradually switched back to original conduction states. Lastly, in the third transient state TT3, the cancellation of the capacitance compensated by the compensation capacitor Cn1 and the compensation capacitor Cn2 is completed. It should be noted that the numerical array of the transient states TT1-TT3 shown in FIG. 5 represents the result after the conversion of the transient state; details of the operation can be referred to FIG. 5.

In the embodiment shown in FIG. 5, the capacitor array A is discussed using four capacitors C1-C4 and the compensation capacitor Cn1 and the compensation capacitor Cn2. However, the present disclosure is not limited thereto, any number of the compensation capacitor is within the contemplated scope of the present disclosure. For example, the number of the compensation capacitor can be one or more than two.

As shown in FIG. 5, the capacitors C1-C4 and the compensation capacitor Cn1 and Cn2 respectively have the capacitance of 2.5, 5, 5, 10, 1.25 and 1.25 units.

In the configuration F5, the switch S2 is at the first conduction state, and the other switches are at the second conduction state, the capacitor array A1 has the capacitance of 5 (0+5+0+0+0+0=5) units. When converting from the configuration F5 to the configuration F6, the switch S2 is converted from the first conduction state to the second conduction state, the switch S1 is converted from the second conduction state to the first conduction state, whereas the conduction states of the other switches remain unchanged, so that the capacitance of the capacitor array A1 is 2.5 (2.5+0+0+0+0+0=2.5) units.

Figure 6:
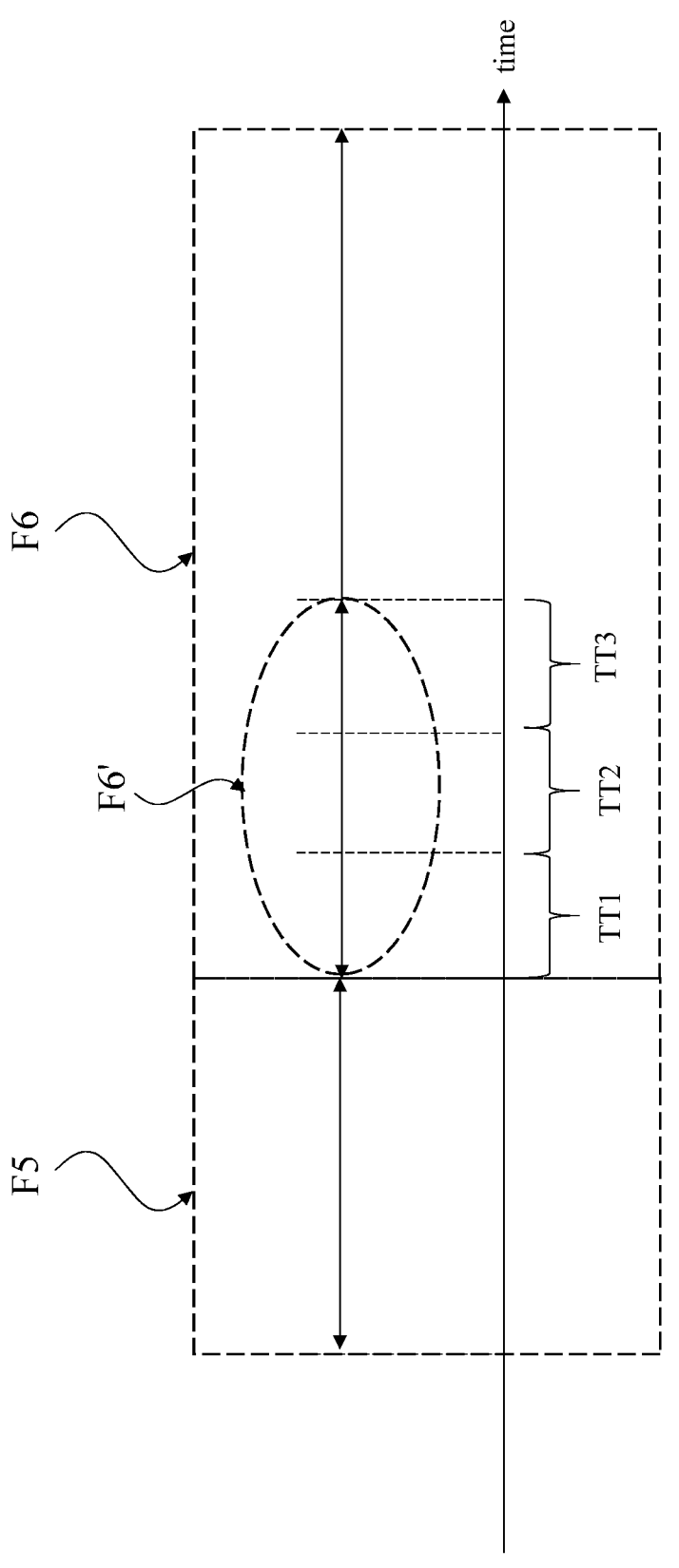
FIG. 6 is a time sequence diagram illustrating the changes of capacitor array configuration according to some embodiments of the present disclosure.

After being converted from the configuration F5 to the configuration F6, the total capacitance of the capacitor array A1 is reduced by 2.5 (5-2.5=2.5) units because of the conversion of the switch S1 and the switch S2; in the meantime, the capacitor array A1 enters the changing state F6' of the configuration F6 (reference is made to FIG. 6); during the first transient state TT1 (right after converting to the configuration F6), the compensation capacitor Cn1 and the compensation capacitor Cn2 are configured to compensate for the lost 2.5 units of the capacitor array A1. Therefore, the switch Sn1 and the switch Sn2 are converted from the second conduction state to the first conduction state, so that the capacitance of the capacitor array A1 is increased by 2.5 units. Next, entering into the second transient state TT2, in which the compensated 2.5 units are gradually decreased to 0. As shown in FIG. 5, right after being converted to the first transient state TT1, the switch Sn1 and the switch Sn2 are converted from the second conduction state to the first conduction state, and then in the second transient state TT2, the switch Sn2 are converted from the first conduction state to the second conduction state, and lastly, the switch Sn1 is converted from the first conduction state to the second conduction state, thereby entering the third transient state TT3. After the completion of the conversion into the third transient state TT3, it enters the stable state of the configuration F6. The total capacitance of the capacitor array A1 changes from 5 units to 3.75 units, and finally to 2.5 units as a result of the conversion of the three transient state TT1-TT3 during the above-mentioned period.

In other words, the compensation capacitor Cn1 and the compensation capacitor Cn2 are configured to prolong the time for the conversion of the total capacitance of the capacitor array A1 (i.e., the time covered by the changing state F6' shown in FIG. 6) so that the capacitance changes of the capacitor array A1 in each phase is lowered, thereby reducing from the disturbance due to the capacitance conversion so as to increase the stability of the PGA 10.

The sum of the capacitances of the compensation capacitor Cn1 and the compensation capacitor Cn2 equals to the minimum capacitance of the capacitors C1-C4. In some embodiments, the sum of the capacitances of the compensation capacitor Cn1 and the compensation capacitor Cn2 is lower than the minimum capacitance of the capacitors C1-C4. In some embodiments, the capacitances of the compensation capacitor Cn1 and the compensation capacitor Cn2 are not the same.

In some other embodiments, the sum of the capacitances of the compensation capacitor Cn1 and the compensation capacitor Cn2 is higher than the minimum capacitance of the capacitors C1-C4, but is lower than a threshold value, wherein the threshold value is configured to indicate that the PGA 10 can ignore its changes corresponding to the capacitance change.

In some embodiments, the capacitor array A includes more than two compensation capacitors, and the capacitances of these compensation capacitors are the same. The capacitance of these compensation capacitors is $m^{-n}$-fold of the minimum capacitance of the capacitors C1-Cx, wherein m and n are positive integers greater than 1.

In view of FIG. 1-FIG. 5, the compensation method provided in the embodiment of FIG. 5 can combine the above-mentioned minimum difference transition and minimum converting transition. That is, irrespective of whether the total capacitance of the capacitor array A1 and the capacitor array A2 changes, the compensation method provided in the embodiment of FIG. 5 can be used to convert the configuration.

The foregoing description briefly sets forth the features of some embodiments of the present application so that persons having ordinary skill in the art more fully understand the various aspects of the disclosure of the present application. It will be apparent to those having ordinary skill in the art that they can easily use the disclosure of the present application as a basis for designing or modifying other processes and structures to achieve the same purposes and/or benefits as the embodiments herein. It should be understood by those having ordinary skill in the art that these equivalent implementations still fall within the spirit and scope of the disclosure of the present application and that they may be subject to various variations, substitutions, and alterations without departing from the spirit and scope of the present disclosure.

What is claimed is:

1. A programmable gain amplifier (PGA), configured to provide a gain value to an input signal to generate an output signal, comprising:

An operational amplifier, configured to output the output signal; and a capacitor array, comprising a first capacitor, a second capacitor and a third capacitor arranged in parallel, wherein each of the first capacitor, the second capacitor, and the third capacitor has a first terminal and a second terminal, wherein the first terminal of each of the first capacitor, the second capacitor, and the third capacitor is configured to receive the input signal, and the second terminals of the first capacitor, the second capacitor, and the third capacitor are selectively coupled to an input terminal of the operational amplifier or a ground terminal, according to a first switch, a second switch and a third switch, respectively, wherein the first capacitor, the second capacitor and the third capacitor respectively have a first capacitance, a second capacitance and a third capacitance, wherein the third capacitance equals to a sum of the first capacitance and the second capacitance, wherein in a first configuration, the first switch and the second switch are operated in a first conduction state, and the third switch is operated in a second conduction state, and when converting from the first configuration to a second configuration, the third switch is operated in the first conduction state, and the first switch and the second switch are operated in the second conduction state, wherein the gain value provided in the first configuration and the gain value provided in the second configuration are the same.

2. The PGA of claim 1, wherein when the first switch, the second switch and/or the third switch are operated in the first conduction state, the first capacitor, the second capacitor and/or the third capacitor respectively corresponding to the first switch, the second switch and/or the third switch are operated as a first capacitor array, and when the first switch, the second switch and/or the third switch are operated in the second conduction state, the first capacitor, the second capacitor and/or the third capacitor respectively corresponding to the first switch, the second switch and/or the third switch are operated as a second capacitor array.

3. The PGA of claim 2, wherein in a third configuration, the second switch is operated in the first conduction state, and the first switch and the third switch are operated in the second conduction state, wherein when converting from the third configuration to a fourth configuration, the third switch is operated in the first conduction state and the first switch and the second switch are operated in the second conduction state, and wherein the gain value provided in the third configuration and the gain value provided in the fourth configuration are not the same.

4. The PGA of claim 3, wherein the capacitor array further comprises a first compensation capacitor, selectively coupled to the input terminal or the ground terminal according to a first compensation switch, wherein the first compensation capacitor has a compensation capacitance, wherein the compensation capacitance is less than or equal to the first capacitance.

5. The PGA of claim 4, wherein during a first period after converting the first capacitor from operating as the first capacitor array to operating as the second capacitor array, the first compensation switch is configured to convert from the second conduction state to the first conduction state and then to the second conduction state, wherein during the first period, the second capacitor and the third capacitor are operated as the second capacitor array.

6. The PGA of claim 5, wherein during a second period after converting the first capacitor from operating as the second capacitor array to operating as the first capacitor array, the first compensation switch is configured to convert from the first conduction state to the second conduction state and then to the first conduction state, wherein during the second period, the second switch and the third switch are not converted.

7. The PGA of claim 6, wherein the capacitor array further comprises a second compensation capacitor, selectively coupled to the input terminal or the ground terminal according to a second compensation switch, wherein the second compensation capacitor has the compensation capacitance.

8. The PGA of claim 7, wherein during the first period, the second compensation switch is configured to convert from the second conduction state to the first conduction state and then to the second conduction state.

9. The PGA of claim 7, wherein during the second period, the second compensation switch is configured to convert from the first conduction state to the second conduction state and then to the first conduction state.

10. The PGA of claim 1, wherein the first capacitance equals to the second capacitance.

11. A gain control method, configured to provide a gain value to an input signal to generate an output signal, comprising:

using a capacitor array to receive the input signal, wherein the capacitor array is coupled to an input terminal of an operational amplifier and comprises a first capacitor, a second capacitor and a third capacitor arranged in parallel, wherein each of the first capacitor, the second capacitor, and the third capacitor has a first terminal and a second terminal, wherein the first terminal of each of the first capacitor, the second capacitor, and the third capacitor is configured to receive the input signal, and the second terminals of the first capacitor, the second capacitor, and the third capacitor are selectively coupled to an input terminal of the operational amplifier or a ground terminal according to a first switch, a second switch and a third switch, respectively, wherein the first capacitor, the second capacitor and the third capacitor respectively has a first capacitance, a second capacitance and a third capacitance, wherein the third capacitance equals to a sum of the first capacitance and the second capacitance;

in a first configuration, operating the first switch and the second switch in a first conduction state, and operating the third switch in a second conduction state;

when converting from the first configuration to a second configuration, operating the third switch in the first conduction state, and operating the first switch and the second switch in the second conduction state, wherein the gain value provided in the first configuration and the gain value provided in the second configuration are the same; and using the operational amplifier to output the output signal according to the second configuration.

12. The gain control method of claim 11, wherein when the first switch, the second switch and/or the third switch are operated in the first conduction state, operating the first capacitor, the second capacitor and/or the third capacitor respectively corresponding to the first switch, the second switch and/or the third switch as a first capacitor array, and when the first switch, the second switch and/or the third switch are operated in the second conduction state, the first capacitor, the second capacitor and/or the third capacitor respectively corresponding to the first switch, the second switch and/or the third switch operate as a second capacitor array.

13. The gain control method of claim 12, further comprising:

in a third configuration, operating the second switch in the first conduction state, and operating the first switch and the third switch in the second conduction state; and when converting from the third configuration to a fourth configuration, operating the third switch in the first conduction state, and operating the first switch and the second switch in the second conduction state, wherein the gain value provided in the third configuration and the gain value provided in the fourth configuration are not the same.

14. The gain control method of claim 13, wherein the capacitor array further comprising a first compensation capacitor selectively coupled to the input terminal or the ground terminal according to a first compensation switch, wherein the first compensation capacitor has a compensation capacitance.

15. The gain control method of claim 14, further comprising: when converting from the third configuration to the fourth configuration, converting the first compensation switch from the first conduction state to the second conduction state and then to the first conduction state.

16. The gain control method of claim 14, wherein the capacitor array further comprises a second compensation capacitor selectively coupled to the input terminal or the ground terminal according to a second compensation switch, wherein the second compensation capacitor has the compensation capacitance.

17. The gain control method of claim 16, further comprising:

when converting from the third configuration to the fourth configuration, converting the second compensation from the first conduction state to the second conduction state and then to the first conduction state.

18. The gain control method of claim 14, wherein the compensation capacitance is less than or equal to the second capacitance.

19. The gain control method of claim 11, wherein the gain value in the first configuration and the gain value in the second configuration are the same.

20. The gain control method of claim 11, wherein the first capacitance equals to the second capacitance.

* * * * *